United States Patent [19]
Sato

[11] Patent Number: 6,049,098
[45] Date of Patent: Apr. 11, 2000

[54] BIPOLAR TRANSISTOR HAVING AN EMITTER REGION FORMED OF SILICON CARBIDE

[75] Inventor: Fumihiko Sato, Tokyo, Japan

[73] Assignee: NEC Corporation, Japan

[21] Appl. No.: 08/639,226

[22] Filed: Apr. 26, 1996

[30] Foreign Application Priority Data

Apr. 27, 1995 [JP] Japan ................................. 7-103757

[51] Int. Cl.[7] ..................... H01L 29/06; H01L 31/0312; H01L 31/0328
[52] U.S. Cl. .......................... 257/198; 257/77; 257/197; 257/19
[58] Field of Search ............................ 257/19, 197, 198, 257/77

[56] References Cited

U.S. PATENT DOCUMENTS

| | | | |
|---|---|---|---|
| 5,296,391 | 3/1994 | Sato et al. ................................. | 437/31 |
| 5,323,032 | 6/1994 | Sato et al. ................................. | 257/198 |
| 5,378,921 | 1/1995 | Ueda ....................................... | 257/574 |

FOREIGN PATENT DOCUMENTS

| | | |
|---|---|---|
| 0 384 113 | 8/1990 | European Pat. Off. . |
| 0384113 | 8/1990 | European Pat. Off. . |
| 62-265762 | 11/1987 | Japan . |
| 4330730 | of 1992 | Japan . |
| 4330730 | 11/1992 | Japan . |
| 5182980 | of 1993 | Japan . |
| 562991 | of 1993 | Japan . |
| 5243253 | 9/1993 | Japan . |
| 6168952 | of 1994 | Japan . |

OTHER PUBLICATIONS

IEEE Transactions on Electron Devices, Aug. 1994, vol. 41, No. 8, pp. 1373–1378.
Sato et al; "A Super Self–Aligned Selectively Grown SiGe Base (SSSB) Bipolar Transistor Fabricated by Cold–Wall Type UHV/CVD Technology";Aug. 1994; pp. 1373–78; IEEE Transactions of Electron Devices, vol. 41, No. 8.

*Primary Examiner*—Tom Thomas
*Assistant Examiner*—Ori Nadav
*Attorney, Agent, or Firm*—Hayes, Soloway, Hennessey, Grossman & Hage, P.C.

[57] ABSTRACT

A bipolar transistor comprises a collector region composed of an N type silicon, a base region composed of a P type silicon film in contact with the N type collector region and a P type SiC film in contact with at least one portion of P type silicon film, and an emitter region of an N type SiC film in contact with at least one portion of the P type SiC film.

5 Claims, 10 Drawing Sheets

FIGURE 4E

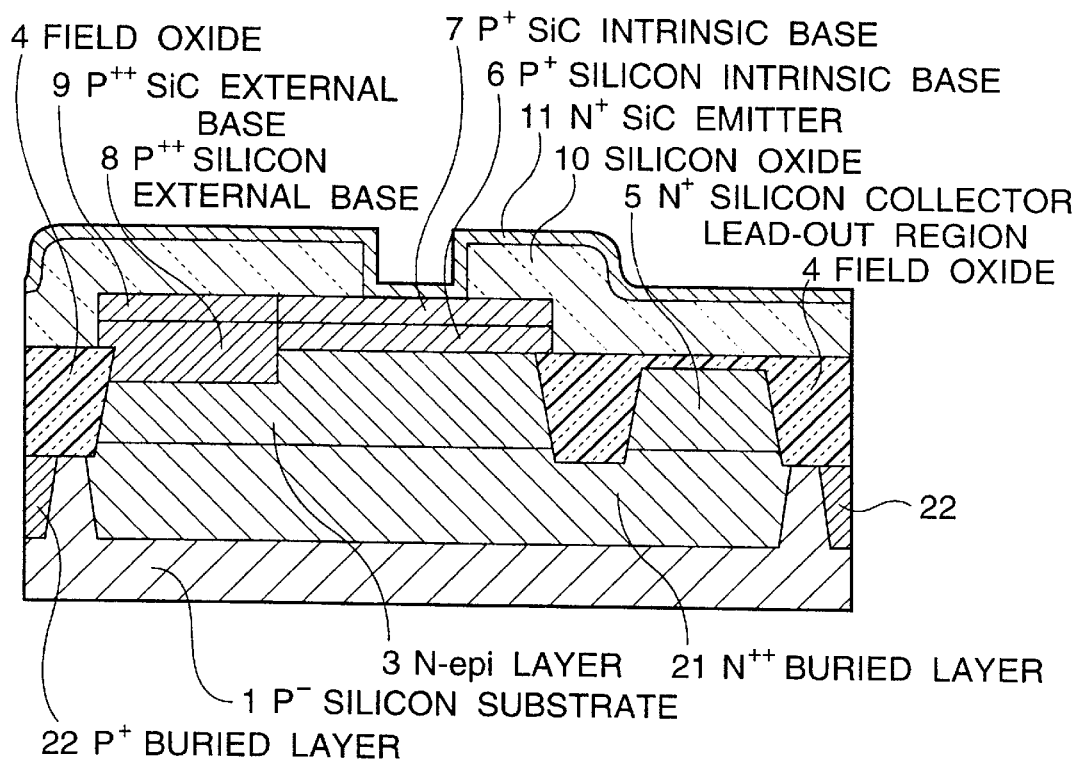

- 4 FIELD OXIDE
- 9 P$^{++}$ SiC EXTERNAL BASE
- 8 P$^{++}$ SILICON EXTERNAL BASE
- 7 P$^+$ SiC INTRINSIC BASE
- 6 P$^+$ SILICON INTRINSIC BASE
- 11 N$^+$ SiC EMITTER
- 10 SILICON OXIDE
- 5 N$^+$ SILICON COLLECTOR LEAD-OUT REGION
- 4 FIELD OXIDE
- 22
- 3 N-epi LAYER
- 21 N$^{++}$ BURIED LAYER
- 1 P$^-$ SILICON SUBSTRATE
- 22 P$^+$ BURIED LAYER

FIGURE 4F

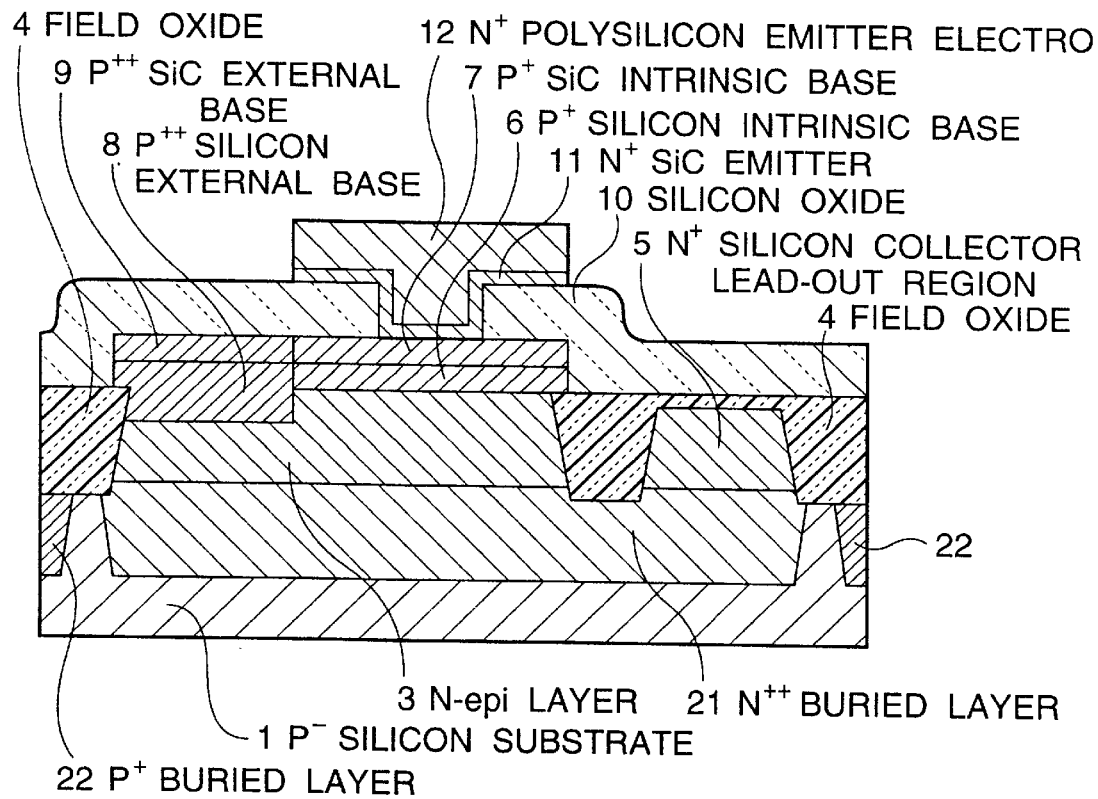

- 4 FIELD OXIDE
- 9 P$^{++}$ SiC EXTERNAL BASE
- 8 P$^{++}$ SILICON EXTERNAL BASE
- 12 N$^+$ POLYSILICON EMITTER ELECTRO
- 7 P$^+$ SiC INTRINSIC BASE
- 6 P$^+$ SILICON INTRINSIC BASE
- 11 N$^+$ SiC EMITTER
- 10 SILICON OXIDE
- 5 N$^+$ SILICON COLLECTOR LEAD-OUT REGION
- 4 FIELD OXIDE
- 22
- 3 N-epi LAYER
- 21 N$^{++}$ BURIED LAYER
- 1 P$^-$ SILICON SUBSTRATE
- 22 P$^+$ BURIED LAYER

BIPOLAR TRANSISTOR HAVING AN EMITTER REGION FORMED OF SILICON CARBIDE

BACKGROUND OF THE INVENTION

1. Field of the Invention

The present invention relates to a semiconductor device and a method for manufacturing the same, and more specifically to a bipolar transistor having an emitter region formed of a semiconductor having a large forbidden band width, such as a silicon carbide (indicated as "SiC" including SiCx expressed in a general chemical formula).

2. Description of Related Art

Referring to FIG. 1, there is shown a diagram illustrating a relation between respective regions and a depletion layer in a bipolar transistor disclosed in Japanese Patent Application Laid-open Publication No. JP-A-5-243253. The bipolar transistor shown in FIG. 1 includes emitter region 31, a base region 32 and a collector region 33 arranged in the named order in such a manner that a PN junction is formed between the emitter region 31 and the base region 32 and between the base region 32 and the collector region 33. Each of the base region 32 and the collector region 33 is formed of silicon (Si), and the emitter region 31 is formed of SiC 36, so that a Si type HBT (heterobipolar transistor or heterojunction bipolar transistor).

In operation, under a given biasing condition, a depletion layer 34 is formed between the emitter region 31 and the base region 32, because of the PN function between the emitter region 31 and the base region 32, and a depletion layer 35 is formed between the base region 32 and the collector region 33, because of the PN junction between the base region and the collector region 33.

The reason for using the emitter formed of SiC is that, as explained in JP-A-5-243253, even if an impurity concentration of the base region is made high in order to make a base resistance small, an increase of a tunnel current can be suppressed since a forbidden band of the emitter is wide.

In this connection, the thicker the SiC layer is, the more it is effective in suppressing the increase of the tunnel current. However, if the SiC layer is too thick, an emitter resistance becomes high. The cause for this is that it is difficult to activate the SiC layer by adding impurities into SiC with a high concentration.

SUMMARY OF THE INVENTION

Accordingly, it is an object of the present invention to provide a bipolar transistor which has overcome the above mentioned defect of the conventional one, and a method for manufacturing the same.

Another object of the present invention is to provide a bipolar transistor having an emitter region formed of a silicon carbide, capable of minimizing the increase of the tunnel current and of also minimizing the increase of the emitter resistance, and a method for manufacturing the same.

The above and other objects of the present invention are achieved in accordance with the present invention by a bipolar transistor comprising:

a collector region composed of a semiconductor layer of a first conductivity type of a semiconductor substrate;

a base region composed of a first semiconductor film of a second conductivity type selectively formed in contact with the semiconductor layer, the first conductivity type being opposite to the first conductivity type, and a second semiconductor film of the second conductivity type formed in contact with at least one portion of the first semiconductor film and having a forbidden band width larger than that of the first semiconductor film; and an emitter region composed of a third semiconductor film of the first conductivity type formed of the same material as that of the second semiconductor film, in contact with at least one portion of the second semiconductor film.

Preferably, it is so configured that under a bias voltage condition for operating the bipolar transistor, the whole of the second semiconductor layer is brought into a depletion condition.

In an embodiment, the bipolar transistor further includes an insulating film formed on the semiconductor substrate and having an opening exposing the semiconductor layer, the first and second semiconductor films being formed within the opening, a first polycrystalline semiconductor film of the second conductivity type formed having an extension extending inwardly from the whole of periphery of the opening by a predetermined distance so as to leave a central portion of the opening, a second polycrystalline semiconductor film of the second conductivity type formed to extend downward from a bottom of the extension of the first polycrystalline semiconductor film, the second polycrystalline semiconductor film being in contact with the first semiconductor film at a middle level of an inner wall height of the opening.

In a preferred embodiment, each of the first and second semiconductor films are formed of silicon carbide.

In addition, the semiconductor film is formed of a material selected from a group consisting of a silicon film, a silicon-germanium mixed-crystal film and a composite film composed of a silicon film and a silicon-germanium mixed-crystal film.

According to another aspect of the present invention, there is provided a method for manufacturing a bipolar transistor, comprising the steps of:

forming a first insulating film on a surface of a semiconductor layer of a first conductivity type of a semiconductor substrate;

forming a first polysilicon semiconductor film having a first opening on the first insulating film;

forming a second insulating film on a surface of the first polysilicon semiconductor film and a side surface of the first opening;

selectively removing the first insulating film using the second insulating film and the first polysilicon semiconductor film as a mask, to form in the first insulating film a second opening larger than the first opening;

growing a first polycrystalline semiconductor film of a second conductivity type from the surface of the semiconductor layer within the second opening, the second conductivity type being opposite to the first conductivity type;

growing a second polycrystalline semiconductor film of the second conductivity type from a lower surface of a projection of the first polycrystalline semiconductor film projecting into the second opening, so that the first and second polycrystalline semiconductor films come in contact with each other;

growing from the surface of the first semiconductor film, a second semiconductor film of the second conductivity type having a forbidden band width larger than that of the first semiconductor film, until the second semiconductor film comes in contact with the second insulating film; and growing from a surface of the semiconductor film, a third semiconductor film of the first conductivity type composed of the same material as that of the second semiconductor film.

Preferably, the growth of the first, second and third semiconductor films are continuously performed in the same apparatus.

As seen from the above, the bipolar transistor in accordance with the present invention is characterized in that not only the emitter region but also a portion of the base region (the second semiconductor film of the second conductivity type) are formed of a semiconductor having a forbidden band width larger than that of the first semiconductor film, for example, SiC, and the thickness of the semiconductor (SiC) having a large forbidden band width is set to the effect that, under a biasing condition for operating the transistor, the second semiconductor film of the second conductivity type having a larger forbidden band width (SiC film portion of the base region) is put in a depletion condition. As a result, since the total thickness of the semiconductor films (for example SiC) having a large forbidden band width is large, it becomes possible to suppress or minimize the tunnel current. On the other hand, since it is possible to reduce the thickness of the semiconductor film (SiC) having a large forbidden band width in a neutralized region put in the depletion condition, it is possible to reduce the emitter resistance.

Here, it is preferred that the whole of the semiconductor film (for example SiC) having a large forbidden band width in the base region is completely put in a depletion condition. Because, if in the semiconductor film of the base region (for example SiC) having a large forbidden band width there remains a portion which is not put in the depletion condition, it prevents an elevation of a carrier injection efficiency, which is an advantage of a bipolar transistor having an emitter region formed of a semiconductor (for example SiC) having a large forbidden band width. Of course, even if in the semiconductor film of the base region (for example SiC) having a large forbidden band width there remains a portion which is not put in the depletion condition, the thickness of the un-depleted portion is sufficiently thinner that a carrier diffusion length, it is possible to obtain a transistor having a characteristics improved in comparison with a HBT having an emitter, a base, and a collector all of which are formed of a silicon.

In the following, explanation will be made on a current-voltage characteristics of a current flowing between a pair of ends sandwiching a semiconductor material having a large forbidden band width.

First, diode characteristics of PN junctions between homogeneous materials, namely, the same materials (homojunction), will be described.

The general characteristics are as follows: Under a forward direction biasing condition, a current (current density) J is expressed as follows:

$$J = Js\{\exp(qV/kT) - 1\}$$

where Js=value determined by physical constants
V=voltage applied across the PN junction
q=electric charge of electron
k=Boltsmann constant
T=absolute temperature If the PN junction is formed between different materials, namely, the PN junction is formed of a heterojunction, the current is expressed as follows:

$$J = Jo(1 - V/Vbi) * \{\exp(qV/kT) - 1\}$$

where Jo=value determined by physical constants
Vbi=built-in potential

Here, if J is expressed by only a voltage dependency, it can be approximately expresse as follows:

$$J \approx \exp(qV/nkT)$$

On the other hand, if a forward direction bias is applied across a $P^+$-$N^+$ junction formed between a pair of highly impurity-doped materials, a current flows through the junction because carriers move through a depletion layer formed between the pair of materials, by action of a quantum tunneling phenomenon. This tunneling probability Tt is expressed as follows:

$$Tt \approx \exp(-A \cdot Eg^{3/2})$$

where A=value determined by an effective mass of a carrier and an electric field within a depletion layer
Eg=forbidden band width As seen from the equation of Tt, the emitter-base PN junction is formed in semiconductor material (SiC) having a large forbidden band width, and the tunnelling current is suppressed by using a material having a forbidden band width Eg in the depletion layer.

The above mentioned equations are explained in, for example, S. M. Sze, "Physics of Semiconductor Devices".

The above and other objects, features and advantages of the present invention will be apparent from the following description of preferred embodiments of the invention with reference to the accompanying drawings.

BRIEF DESCRIPTION OF THE DRAWINGS

FIGS. 4A to 4F are sectional views illustrating a process for manufacturing the first embodiment of the bipolar transistor in accordance with the present invention;

DESCRIPTION OF THE PREFERRED EMBODIMENTS

Figure 1:
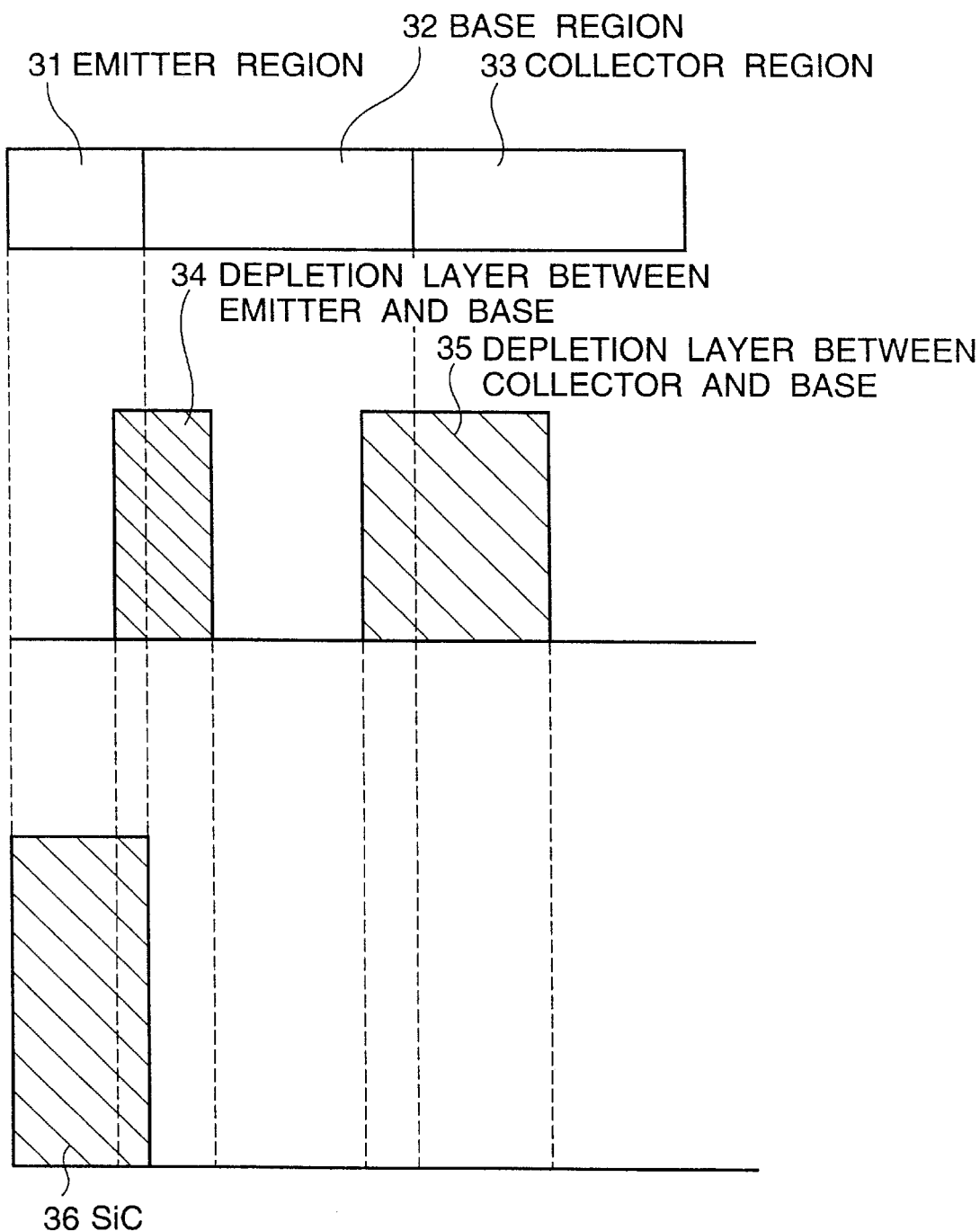
FIG. 1 is a diagram illustrating a relation between respective regions and a depletion layer in a conventional bipolar transistor having an emitter region formed of a silicon carbide.
Figure 2:
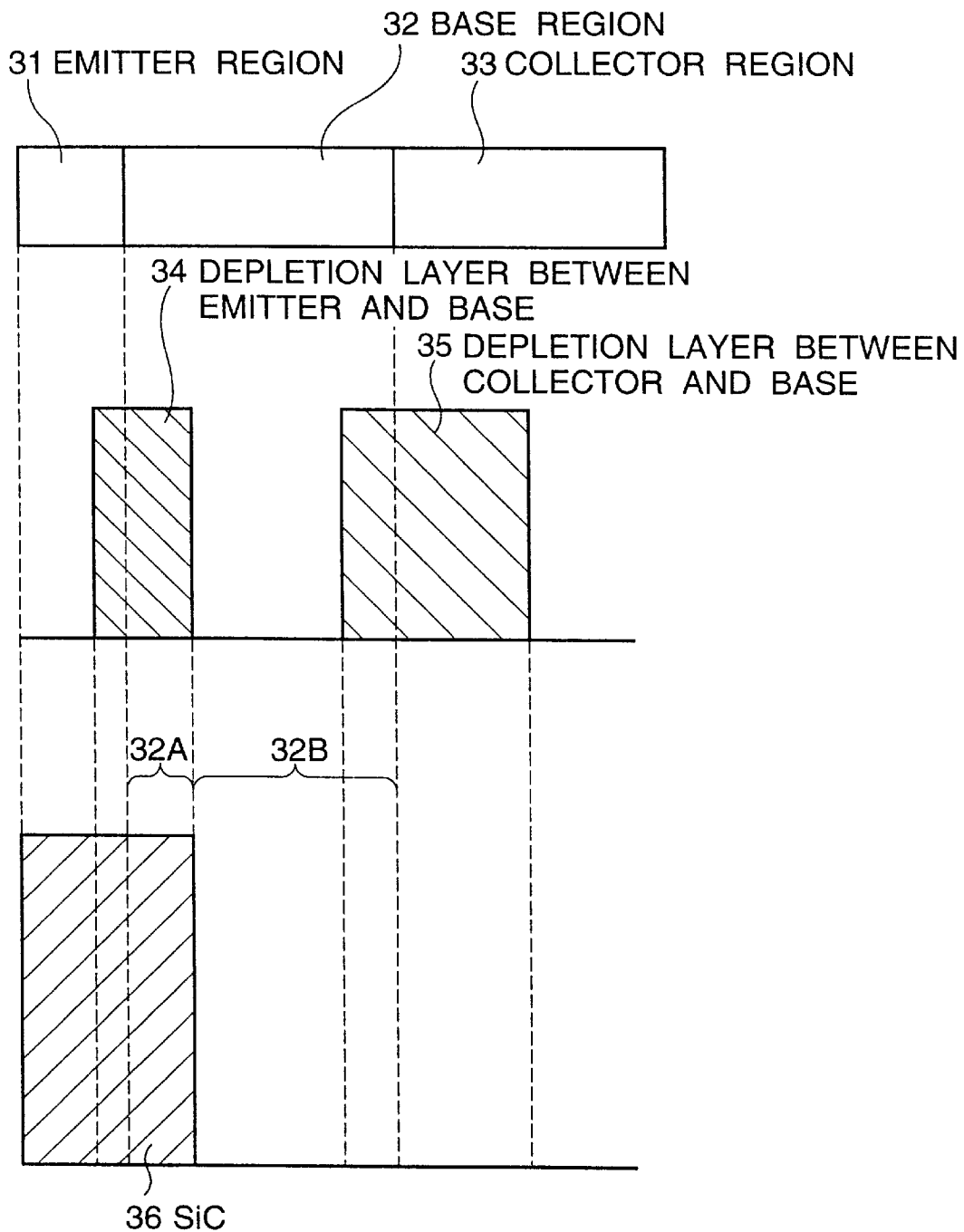
FIG. 2 is a diagram illustrating a relation between respective regions and a depletion layer in a bipolar transistor having an emitter region formed of a silicon carbide in accordance with the present invention.

Referring to FIG. 2, there is shown a diagram illustrating a relation between respective regions and a depletion layer in a bipolar transistor having an emitter region formed of a silicon carbide in accordance with the present invention.

The bipolar transistor shown in FIG. 2 includes emitter region 31, a base region 32 and a collector region 33 arranged in the named order in such a manner that one PN junction is formed between the emitter region 31 and the base region 32 and another PN junction is formed between the base region 32 and the collector region 33.

In operation, under a given biasing condition, a depletion layer 34 between the emitter region 31 and the base region 32 is formed from the emitter-base PN junction, and a depletion layer 35 between the base region 32 and the collector region 33 is formed from the collector-base PN junction between the collector region 33 and the base region 32.

In the above construction, the emitter region 31 is formed of SiC, and the collector region 33 is formed of silicon (Si). The base region 32 is formed of an emitter side portion 32A composed of SiC having a forbidden band width larger than that of the silicon, and a collector side portion 32B formed of silicon. The base portion 32A composed of SiC is positioned within the depletion layer 34 under an operation biasing condition.

Figure 3:
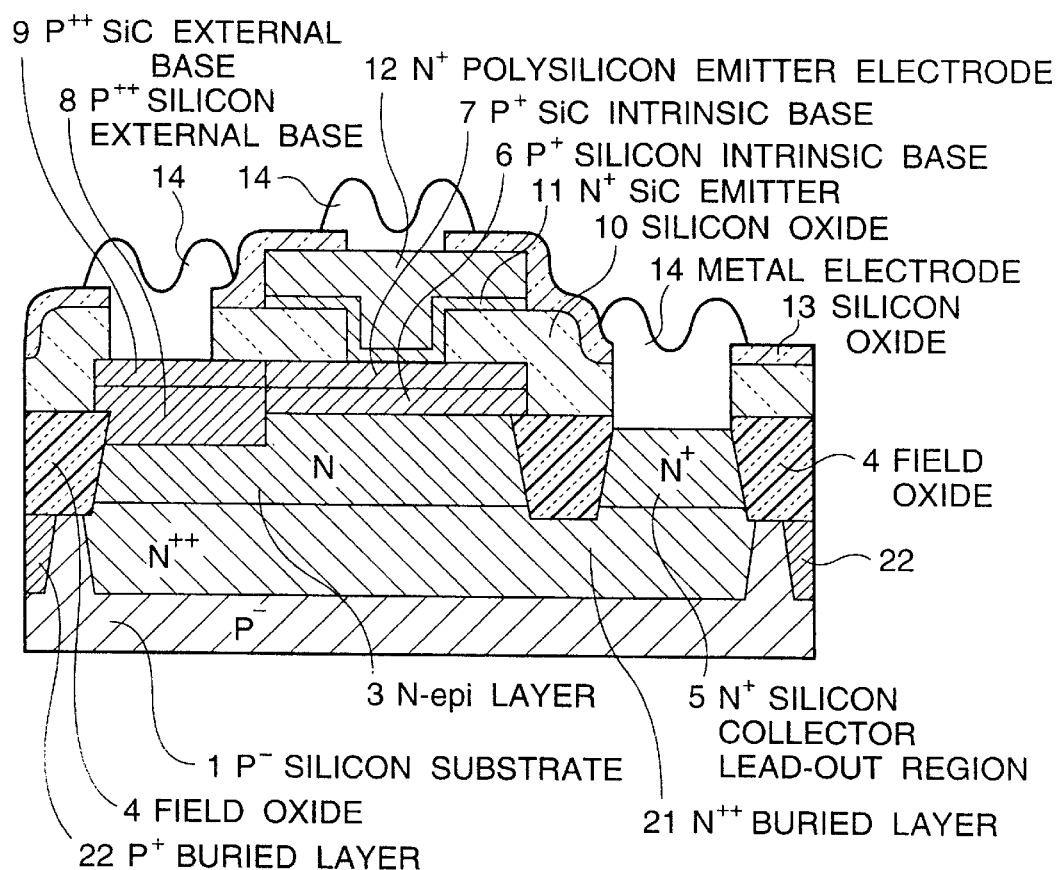
FIG. 3 is a diagrammatic sectional view of a first embodiment of the bipolar transistor in accordance with the present invention.

Referring to FIG. 3, there is shown a diagrammatic sectional view of a first embodiment of the bipolar transistor in accordance with the present invention. In FIG. 3, Reference Numeral 1 designates a P⁻ single crystalline silicon substrate having a principal surface, in which an N⁺⁺ buried layer 21 and a channel stopper P⁺ buried layer 22 are selectively formed. On the N⁺⁺ buried layer 21, an N silicon epitaxial layer 3 is formed. This N silicon epitaxial layer 3 constitutes a collector region, and a field oxide film 4 is formed by means of a selective oxidation called a LOCOS process, to extend from an upper surface of the N silicon epitaxial layer 3 and to reach the N⁺⁺ buried layer 21 and the P⁺ buried layer 22. Furthermore, in order to reduce a collector resistance, an N⁺ collector lead-out region 5 is formed on a portion of the N⁺⁺ buried layer 21.

In the present invention, on the N silicon epitaxial layer 3, there are formed a P⁺ silicon intrinsic base 6 and a P⁺ SiC intrinsic base 7, which constitute an intrinsic base of a base region.

Furthermore, an external base of the base region is formed, which is composed of a P⁺⁺ silicon external base 8 having an impurity concentration higher than that of the P⁺ silicon intrinsic base 6 and a depth deeper than that of the P⁺ silicon intrinsic base 6, and a P⁺⁺ SiC external base 9 formed on the P⁺⁺ silicon external base 8, in order to sufficiently reduce a contact resistance between the base region and a base metal electrode 14 formed on the base region, and in order to avoid the base metal electrode 14 from being contacted directly with the collector region 3.

An insulating film such as a silicon oxide film 10 is formed to cover the field oxide film 4, the N⁺ collector lead-out region 5, the P⁺ SiC intrinsic base 7, and the P⁺⁺SiC external base 9. An opening is formed in the silicon oxide film 10 above the P⁺⁺SiC external base 9, so as to expose the P⁺ SiC intrinsic base 7 within the opening. In the opening, an N⁺ SiC emitter 11 is formed, as an emitter, to form a PN junction between the P⁺ SiC intrinsic base 7 and the N⁺ SiC emitter 11. An N⁺ polysilicon emitter electrode 12 is formed on the N⁺ SiC emitter 11. In addition, another insulating film such as a silicon oxide film 13 is formed to cover the whole, and a contact hole is formed in the silicon oxide films 13 and 10 to expose the P⁺⁺ SiC external base 9, the N⁺ polysilicon emitter electrode 12 and the N⁺ collector lead-out region 5. An aluminum or its alloy metal electrode 14 is formed on the whole and patterned to form an emitter metal electrode, a base metal electrode and a collector metal electrode, respectively.

Now, a process for manufacturing the first embodiment of the bipolar transistor in accordance with the present invention will be described with reference to FIGS. 4A to 4F.

Figure 4A:
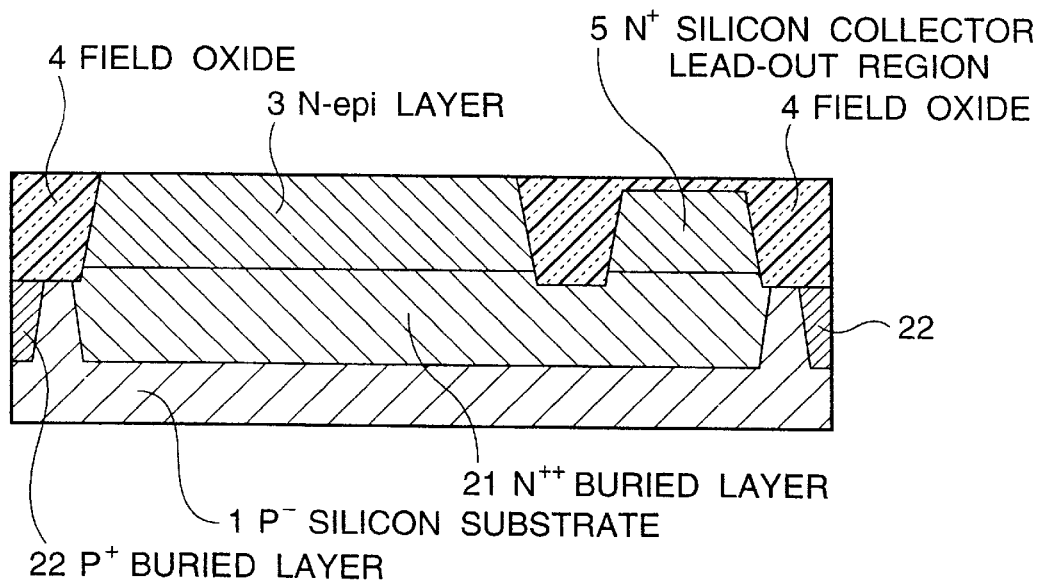

As shown in FIG. 4A, on a P⁻ single crystalline silicon substrate 1 having a resistivity of 10 Ω·cm to 20 Ω·cm, a silicon oxide film (not shown) having a thickness of about 500 nm is formed by a chemical vapor deposition (CVD) process or a thermal oxidation process. Then, a photoresist pattern (not shown) is formed on the silicon oxide film by a photolithography process, and by using the photoresist pattern as a mask, the silicon oxide film is selectively removed by using a mixed liquid composed of a hydrofluoric acid and an ammonium fluoride (called a "buffered HF" hereinafter). And then, the photoresist pattern is removed.

By using the remaining silicon oxide film as a mask, arsenic is ion-implanted into the P⁻ silicon substrate with a condition that an acceleration energy of 50 keV to 100 keV and a dose of $5 \times 10^{15}$ cm$^{-2}$ to $2 \times 10^{16}$ cm$^{-2}$. Thereafter in order to remove crystal defects and in order to form a sufficiently deep N⁺ layer having a low resistance, a heat treatment is performed, for example, at 1150° C. for four hours. As a result, an N⁺⁺ buried layer 21 having a depth of 1.5 μm to 3.0 μm is formed.

Furthermore, in order to form a channel stopper, boron is ion-implanted into the P⁻ silicon substrate with a condition that an acceleration energy of 100 keV and a dose of $1 \times 10^{13}$ cm$^{-2}$. Thereafter, in order to remove crystal defects and for activation, a heat treatment is performed in a nitrogen atmosphere, for example, at 900° C. to 1000° C. for ten minutes to thirty minutes. As a result, a channel stopper P⁺ buried layer 22 is formed. On the N⁺⁺ buried layer 21, an N silicon epitaxial layer 3 is formed.

Thereafter, in order to form a collector region, a conventional epitaxial growth is performed using a SiH$_4$ or SiH$_2$Cl$_2$ as a raw gas, and PH$_3$ as a doping gas. Thus, an N silicon epitaxial layer 3 having a uniform phosphorus concentration of $5 \times 10^{15}$ cm$^{-3}$ to $1 \times 10^{16}$ cm$^{-3}$ and having a thickness of 0.7 μm to 1.0 μm is formed. Accordingly, a single crystalline silicon substrate is constituted of the silicon substrate 1 and the silicon epitaxial layer 3. The N silicon epitaxial layer 3 constitutes an N type collector region 3 when the transistor is completed.

Next, a silicon oxide film (not shown) having a thickness of 30 nm to 50 nm is formed on a surface of the silicon epitaxial layer 3 by a thermal oxidation process, and a silicon nitride film (not shown) having a thickness of about 100 nm is formed by a LPCVD process. A photoresist pattern (not shown) is formed, and by using the photoresist pattern as a mask, an anisotropic etching is performed to sequentially etch the silicon nitride film, the silicon oxide film and the silicon substrate. At this time, the etching depth of the silicon substrate is on the order of 300 μm.

Next, the photoresist pattern is removed, and a selective oxidation is performed by using the pattern silicon nitride film as a mask, so that a field oxide film 4 is formed. The thickness of this field oxide film 4 is suitable in the range of 0.6 μm to 1.2 μm, and is preferred to be on the order of 0.9 μm.

The patterned silicon nitride film used as the mask is completely removed by a hot phosphorus acid, and then, a photoresist pattern (not shown) is formed, and by using the photoresist pattern as a mask, phosphorus is ion-implanted with a condition that an acceleration energy of 70 keV and a dose of $1 \times 10^{16}$ cm$^{2}$. After removing the photoresist pattern, an activating heat treatment is performed to form an N⁺ collector lead-out region 5. The photoresist pattern (not shown) is formed, and by using the photoresist pattern as a mask, the silicon oxide film is removed from only a portion of the silicon oxide film on the N type collector region 3, so that a surface of the N type collector region 3 is exposed.

Figure 4B:
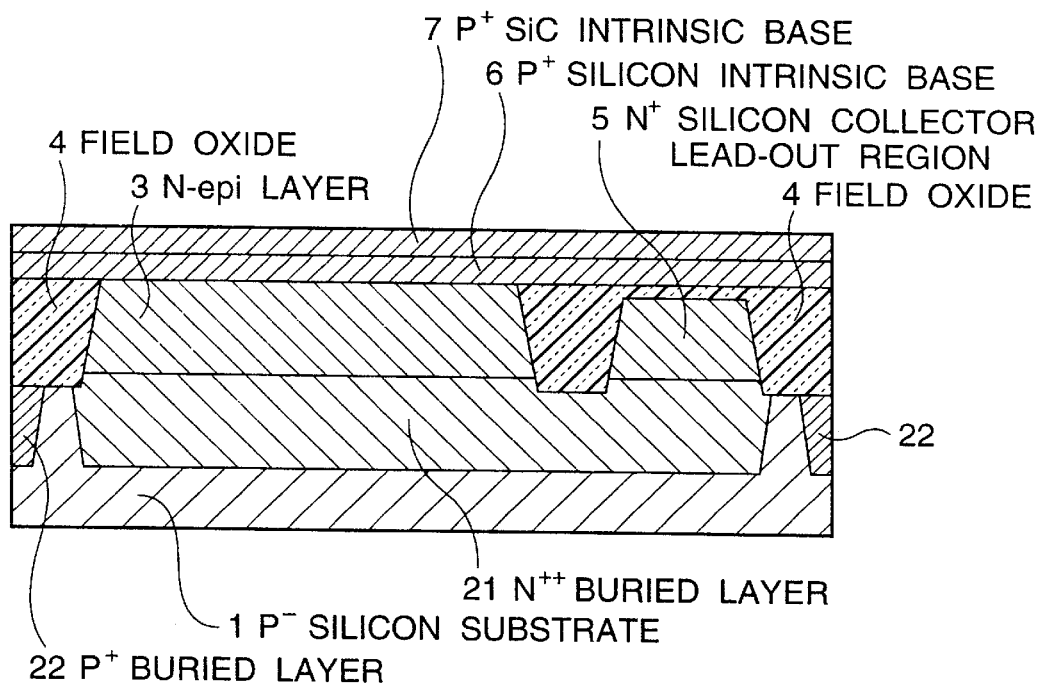

As shown in FIG. 4B, a composite film used for constitute the base region is formed. First, a P$^+$ silicon film 6 constituting a P$^+$ silicon intrinsic base 6 is formed for example a LPCVD process. However, another process such as a ultra high vacuum (UHV) CVD process can be used. One example of a growing condition of the LPCVD process is that a growing pressure is 3 Torr, a raw gas is SiH$_2$Cl$_2$, a doping gas is B$_2$H$_6$, and a growing temperature is 1000° C. Thus, a P$^+$ silicon film 6 having a boron concentration of about 7×10$^{18}$ cm$^{-3}$ and a thickness of about 70 nm is formed.

Succeedingly, a P$^+$ SiC film 7 for constituting a P$^+$ SiC intrinsic base is formed. The forming condition is that a raw gas is Si$_2$H$_6$+C$_2$H$_2$, a doping gas is B$_2$H$_6$, a growing pressure is 5×10$^{-4}$ Torr, and a growing temperature is 900° C. The P$^+$ SiC film 7 thus formed for constituting a P$^+$ SiC intrinsic base has a boron concentration of about 1×10$^{18}$ cm$^{-3}$ and a thickness of about 6.5 nm.

In this connection, although not distinctly depicted in FIG. 4B, the P$^+$ silicon film 6 and the P$^+$ SiC film 7 are polycrystalline on the insulating film such as the field oxide, but a monocrystalline on the epitaxial collector 3, namely, in a portion which will become the P$^+$ silicon intrinsic base 6, the P$^+$ SiC intrinsic base 7, and an external base. However, the P$^+$ SiC intrinsic base 7, and an external base may become somewhat polycrystalline on the epitaxial collector 3.

Figure 4C:
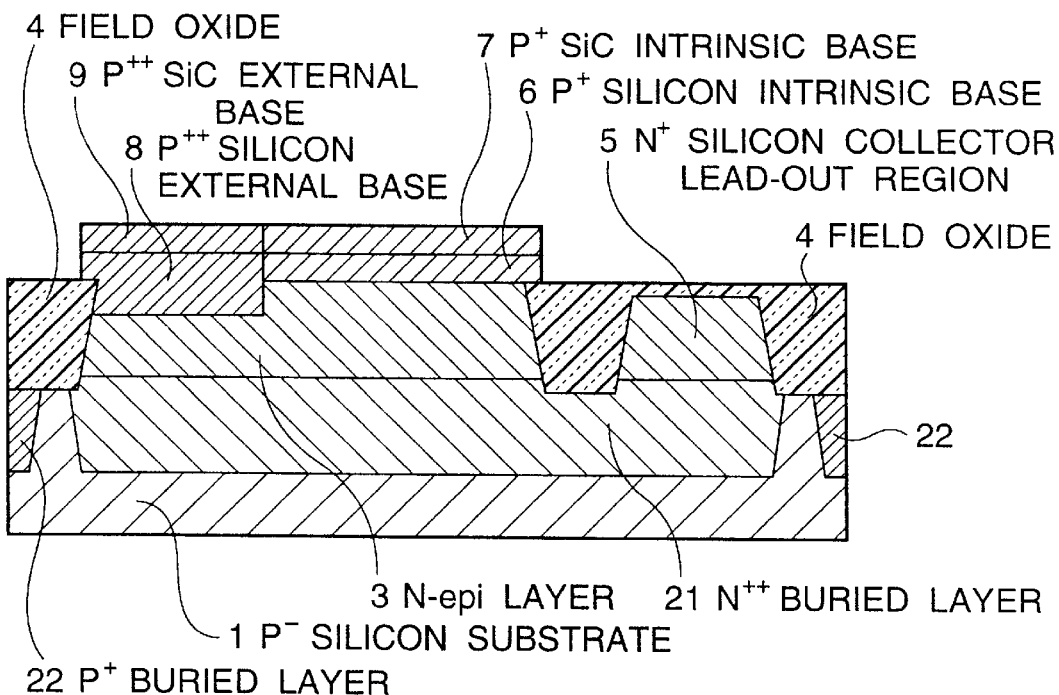

As shown in FIG. 4C, a deep diffused layer is formed in order to prevent a short-circuit between the base and the collector which would have been caused because a metal penetrates the base at the time of forming a metal base electrode. For this purpose, a photoresist pattern (not shown) is formed, and by using the photoresist pattern as a mask, boron is ion-implanted into a region in which deep diffused region is to be formed. An example of the condition for this ion implantation is that an acceleration energy is of 70 keV and a dose is of 2×10$^{15}$ cm$^{-2}$. As a result, a P$^{++}$ silicon external base 8 and a P$^{++}$ SiC external base 9 are formed. Then, when a base is formed by a photolithography and a dry etching, unnecessary polysilicon portions remaining on the field oxide film 4 are removed.

Figure 4D:
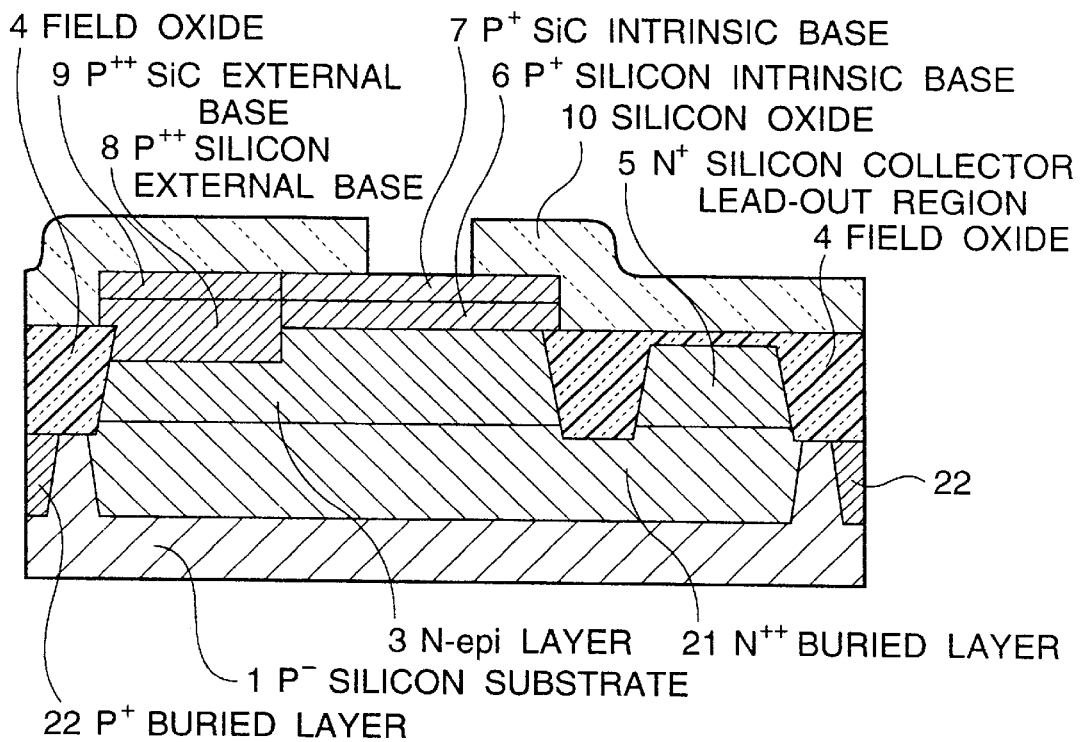

As shown in FIG. 4D, a silicon oxide film 10 is deposited by a CVD process, and an emitter opening is formed by a photolithography and a dry etching. This etching is preferably performed by the buffered HF in order to prevent a damage of a base surface.

As shown in FIG. 4E, an N$^+$ SiC film II is grown in order to form an N$^+$ SiC emitter which constitutes a whole region of the emitter region. The growing condition for this film is fundamentally the same as that for growing the P$^+$ SiC intrinsic film 7 for the P$^+$ SiC intrinsic base, excluding that an impurity doping gas is PH$_3$. Thus, the grown film is N$^+$, and the phosphorus concentration is about 1×10$^{19}$cm$^{-3}$ and the film thickness is about 50 nm. The film thickness of the SiC film as the emitter is required to be thicker than the width of at least a portion extending into the emitter, of the emitter-base depletion layer.

As shown in FIG. 4F, an emitter electrode N$^+$ polysilicon layer having a phosphorus concentration of about 1×10$^{21}$ cm$^{-3}$ and a thickness of about 200 nm, by simultaneously adding an impurity in the course of the deposition. Succeedingly, a photolithography and a dry etching are performed to pattern an N$^+$ SiC emitter 11 and an N$^+$ polysilicon emitter electrode 12.

Thereafter, a silicon oxide film 13 is deposited, and a contact hole for an electrode is formed, and then, an aluminum electrode 14 is formed. Thus, a transistor shown in FIG. 3 is completed.

Next, a characteristics in connection with the tunnel current is compared between the transistor in accordance with the present invention and the transistor of the prior art.

Here, the transistor of the prior art is completely the same as the transistor in accordance with the present invention, in the point that an emitter region is formed of N$^+$ SiC emitter and an N$^+$ polysilicon electrode is formed on the N$^+$ SiC emitter. However, the base region of the prior art transistor has the same boron profile as that of the transistor in accordance with the present invention, but is formed of only silicon.

In order to compare an effect of suppressing the tunnel current, the "n" value of the base current is examined. This "n" value of the base current is defined as follows:

$$I_B = I_{BO} \cdot \exp(n - qV_{BE}/kT)$$

"n" is a value not smaller than "1". The closer the "n" value is to "1", an ideally characteristics can be obtained, and a tunnel current is small.

Figure 5:
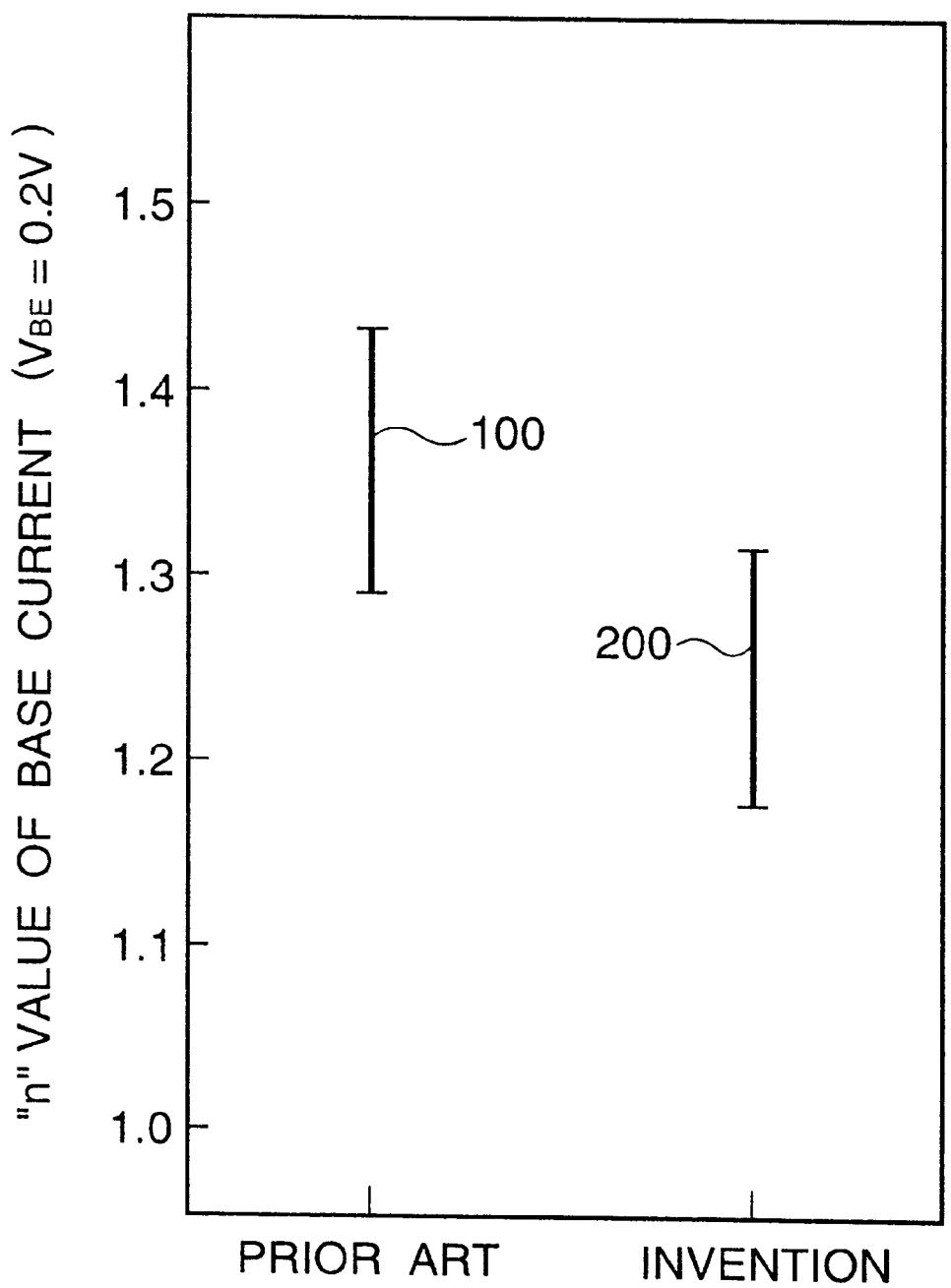
FIG. 5 is a graph comparing the characteristics of the first embodiment of the bipolar transistor in accordance with the present invention and the bipolar transistor of the prior art.

FIG. 5 is a graph illustrating this "n" value when 0.2 V is applied between the base and the emitter. FIG. 5 shows a range between a maximum value and a minimum value of nine points sampled in the same semiconductor wafer.

The characteristics of the "n" value of the prior art is designated by Reference Numeral 100, and the characteristics of the "n" value of the present invention is designated by Reference Numeral 200. Comparing the present invention with the prior art, the improving effect of the present invention of the "n" value is about 0.1. A reason for the fact that a complete improvement cannot be obtained, is that it is influenced by a SiC/Si boundary, for example, existence of recombination center.

Next, a second embodiment of the bipolar transistor in accordance with the present invention will be explained with FIGS. 6A to 6F.

This second embodiment is featured by forming the bipolar transistor by a selective epitaxial technology. In this process, it is possible to form a Si+SiC base, and then, to take out from the apparatus for various processes, and thereafter, to form an SIC emitter and an Si emitter electrode. In the second embodiment, however, the base region and the emitter region are continuously formed in the same apparatus. As a result, since the emitter-base junction is continuously formed, a trap density on a junction boundary can be suppressed to a low level, and therefore, the electric characteristics, particularly, the recombination current of the base current can be reduced.

Furthermore, this process can manufacture the transistor by a reduced number of steps.

Figure 6A:
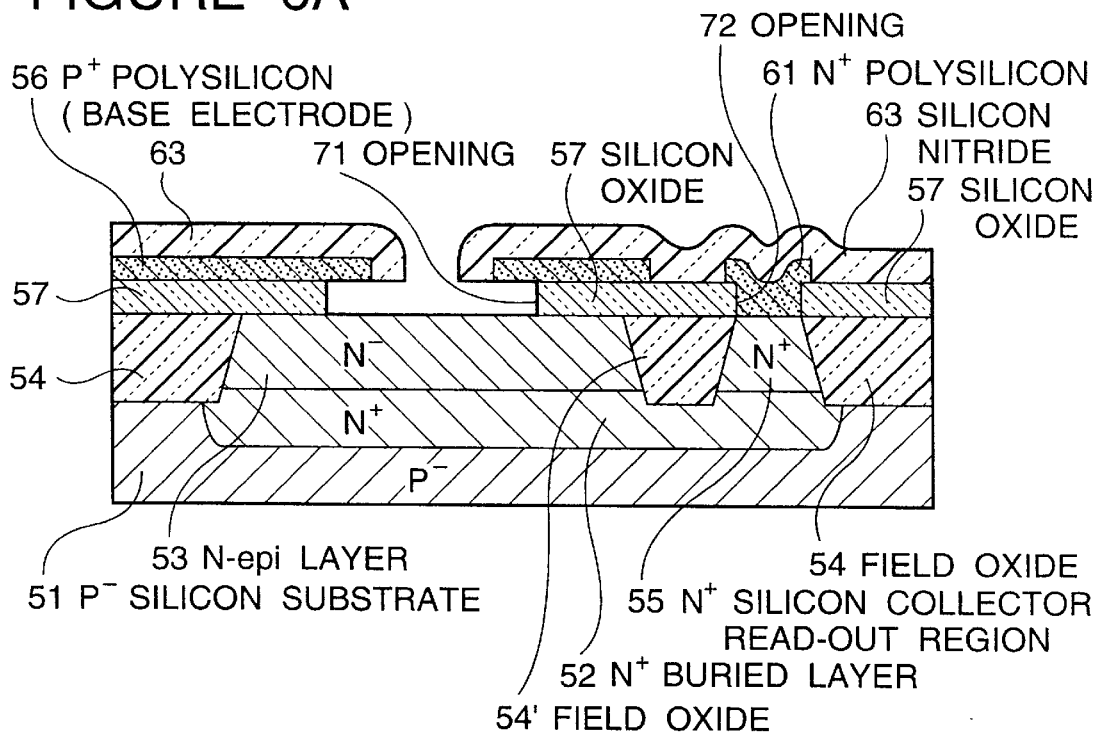
FIGS. 6A to 6F are sectional views illustrating a process for manufacturing a second embodiment of the bipolar transistor in accordance with the present invention.

First, FIG. 6A is a sectional view illustrating a condition just before the base is formed. This is characterized in that a base electrode polysilicon is in the form of a visor or eaves. A method for forming this visor or eaves structure is disclosed by JP-A-4-330730 of this inventor or F. Sato et al, IEEE Transaction on Electron Devices, Vol. 41, No. 8. 1373 (1994).

In FIG. 6A, on a portion of a surface of a P$^-$ single crystalline silicon substrate 51 having a resistivity of 10 Ω•cm to 20 Ω•cm at room temperature, an N$^+$ buried layer 51 is formed, and an N silicon epitaxial layer 53 having the impurity concentration, for example, phosphorus concentration of $5\times10^{15}$ cm$^{-3}$ to $2\times10^{16}$ cm$^{-3}$ and having a thickness of 0.4 μm to 1.3 μm is formed to constitute a silicon substrate. The N silicon epitaxial layer 53 constitutes an N type collector region 53 when the transistor is completed.

Next, a selective thermal oxidation is performed, so that a field oxide film 54 is formed for device isolation. An N$^+$ collector lead-out region 55 doped with phosphorus at a concentration of $1\times10^{19}$ cm$^{-3}$ or more by an ion implantation or a thermal diffusion, in order to reduce the collector resistance.

A silicon oxide film 57 having an opening 71 is formed on the N silicon epitaxial layer 53, and a P$^+$ base electrode polysilicon film 56 having a boron concentration of $1\times10^{20}$ cm$^{-3}$ or more and a thickness of 150 nm to 300 nm is formed on the silicon oxide film 57. The P$^+$ base electrode polysilicon film 56 has an extension or visor or eaves extending inwardly from the whole of a periphery of the opening 71 so as to leave a center region of the opening.

Another opening 72 is formed in the silicon oxide film 57 above the N$^+$ collector lead-out region 55, and an N$^+$ polysilicon collector electrode 61 is formed within the opening 72.

A silicon nitride film 63 is formed to cover a surface of the N$^+$ polysilicon collector electrode 61, a surface of the P$^+$ base electrode polysilicon film 56 and an inside surface of the opening of the P$^+$ base electrode polysilicon film 56.

Figure 6B:
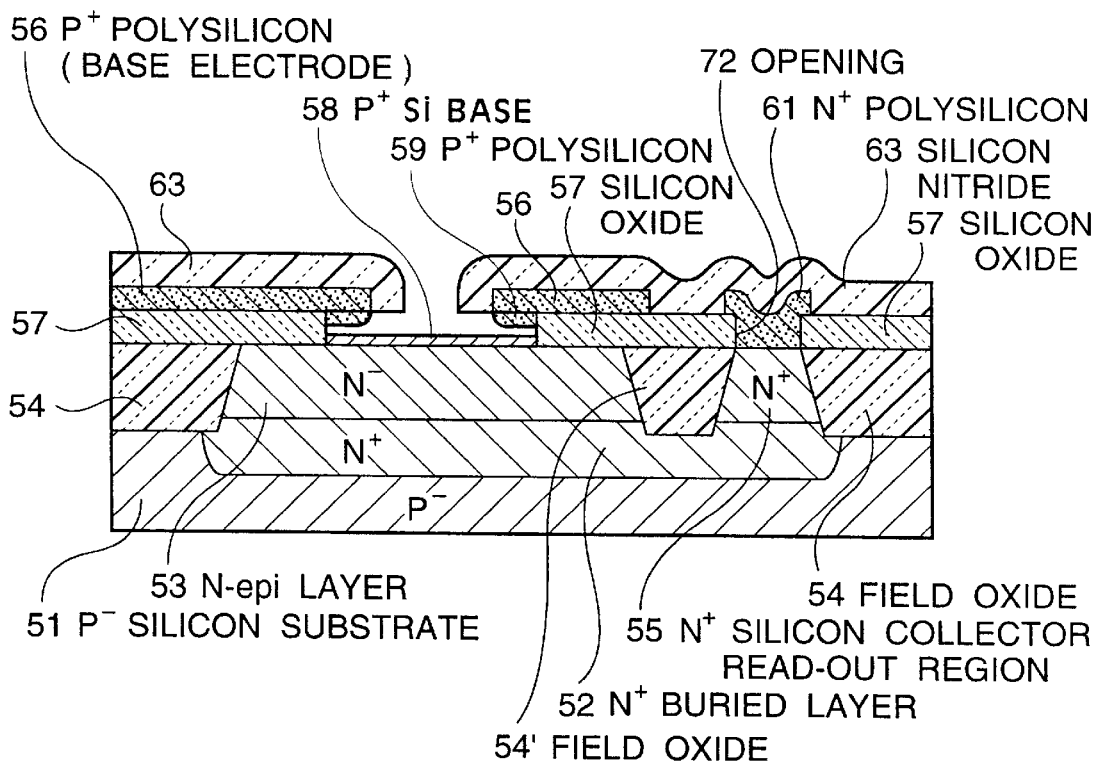

As shown in FIG. 6B, a selective epitaxial growth is performed to deposit a single crystal P$^+$ silicon base layer 58 on the upper surface of the N$^-$ collector layer 53 within the opening 71. At this time, a P$^+$ polysilicon film 59 is simultaneously formed on an lower surface of the extension or visor portion of the P$^+$ base electrode polysilicon film 56 extending into the opening 71.

The method for this selective epitaxial growth is preferred to be a UHVCVD process, but may be a molecular beam epitaxy or a LPCVD. One example of the condition of the UHVCVD process is that a substrate temperature is 600° C., the flow rate of $Si_2H_6$ is 12 sccm and the flow rate of $Cl_2$ is 0.03 sccm.

Figure 6C:
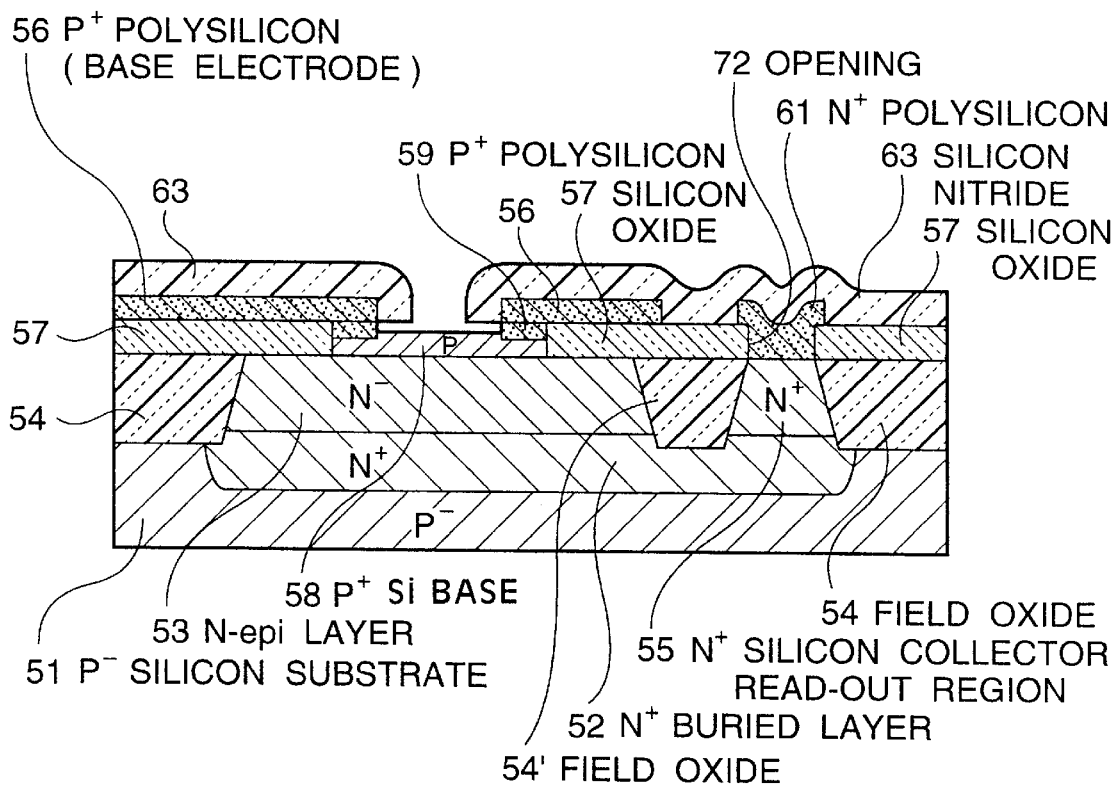

Then, as shown in FIG. 6C, the selective epitaxial growth shown in FIG. 6B is continuously performed, the P$^+$ silicon base layer 58 (constituting the P$^+$ silicon intrinsic base layer) is coupled with or becomes integral with the P$^+$ polysilicon film 59. Thus, finally, the P$^+$ intrinsic base layer 58 having a thickness of about 60 nm and the boron concentration of about $1\times10^{20}$ cm$^{-3}$, is formed.

Figure 6D:
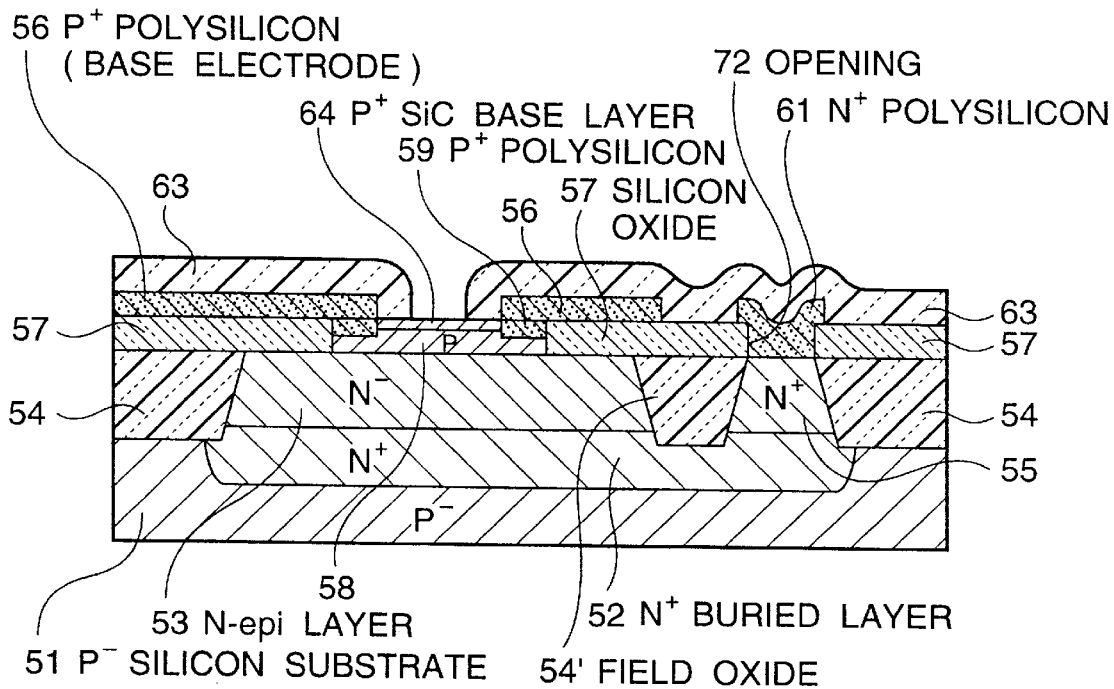

Thereafter, as shown in FIG. 6D, a P$^+$ SiC intrinsic base layer 64 is formed on the P$^+$ intrinsic base layer 58, continuously to the formation of the P$^+$ intrinsic base layer 58, and in the same apparatus in which the P$^+$ intrinsic base layer 58 and the P$^+$ polysilicon film 59 are grown. The P$^+$ SiC intrinsic base layer 64 is basically preferred to be a single crystalline, but may be at a some degree of polycrystalline. For example, this P$^+$ SiC intrinsic base layer 64 has the boron concentration of about $1\times10^{18}$ cm$^{-3}$, and a thickness of about 6.5 nm.

FIG. 6D depicts that when the growth of the P$^+$ SiC intrinsic base layer 64 is completed, the P$^+$ SiC intrinsic base layer 64 just contacts with the silicon nitride film 63. However, after the P$^+$ SiC intrinsic base layer 64 contacts with the silicon nitride film 63, even if the P$^+$ SiC intrinsic base layer 64 is allowed to grow at some degree, if the concentration and the thickness are in the range of the spirit of the present invention, there is no problem.

Figure 6E:
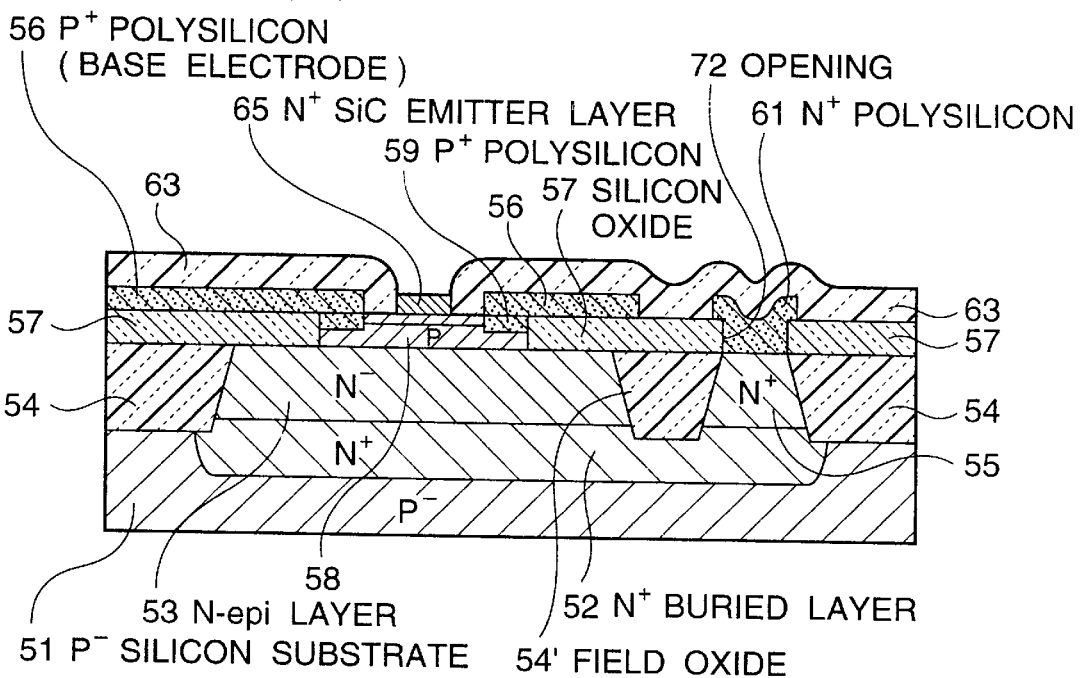
Figure 6F:
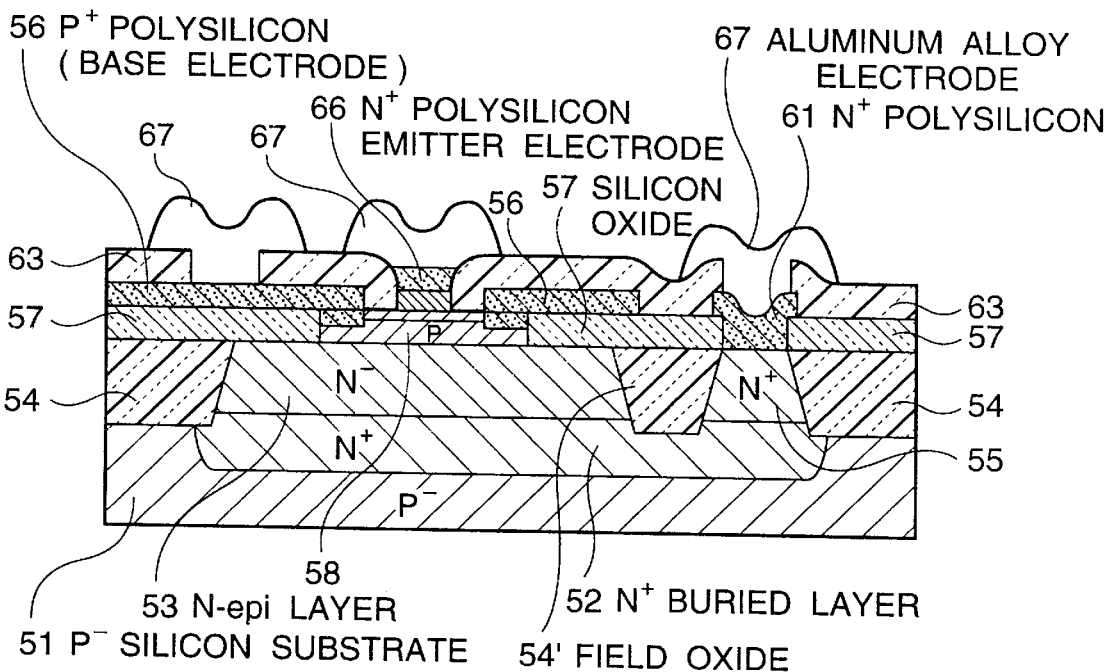

As shown in FIG. 6E, furthermore within the same apparatus, an N$^+$ SiC emitter layer 65 (constituting the whole of the emitter region) is continuously deposited on the P$^+$ SiC intrinsic base layer 64. This N$^+$ SiC emitter layer 65 is basically preferred to be a single crystalline, but may be at a some degree of polycrystalline. For example, this N$^+$ SiC emitter layer 65 has the phosphorus concentration of about $1\times10^{19}$ cm$^{-3}$, and a thickness of about 50 nm.

Then, as shown in FIG. 6E, an emitter electrode N$^+$ polysilicon layer 66 is formed, and an aluminum alloy electrode 67 are deposited and patterned to form a base metal electrode, an emitter metal electrode and a collector metal electrode, respectively.

In the first embodiment explained hereinbefore, after the SiC layer for the base region is grown, the photolithography and the dry etching are performed, and thereafter, the SiC layer for the emitter region is formed. In the second embodiment, however, the SiC layer for the base region and the SiC layer for the emitter region are continuously grown in the same apparatus without being exposed to atmosphere. In the second embodiment, therefore, the deterioration of the base current attributable to the recombination can be suppressed.

As a result, the "n" value of the first embodiment was 1.175 to 1.315, but on the other hand, the "n" value of the second embodiment was 1.15 to 1.27.

In the above mentioned embodiments, the intrinsic base under the SiC base is formed of silicon (Si), but can be formed of SiGe (silicon-germanium mixed-crystal) or a composite film of the silicon film and the SiGe film.

As seen from the above, since not only in the emitter region in but also in the base material in the emitter-base depletion layer, the forbidden band width is larger than that of the base material in the region other than the depletion region, even if the base region is thinned and made to have a high impurity concentration for the purpose of obtaining a high cutoff frequency and a low base resistance, it is possible to minimize the tunnel current in the base current, and to prevent the increase of the emitter resistance.

The invention has thus been shown and described with reference to the specific embodiments. However, it should be noted that the present invention is in no way limited to the details of the illustrated structures but changes and modifications may be made within the scope of the appended claims.

What is claimed is:

1. A bipolar transistor comprising:
    a collector region composed of a semiconductor layer of a first conductivity type formed of silicon and formed in a semiconductor substrate;
    a base region composed of an intrinsic base and an external base, said intrinsic base consisting of a first discrete semiconductor film of a second conductivity type formed of a material selected from a group consisting of a silicon film, a silicon-germanium mixed-crystal film and a composite film composed of silicon film and a silicon-germanium mixed-crystal film, selectively formed in contact with said semiconductor layer, said second conductivity type being opposite to said first conductivity type, and a second discrete semiconductor film of silicon carbide formed in contact with at least one portion of said first discrete semiconductor film and having a forbidden band width larger than that of said first discrete semiconductor film and also larger than that of said semiconductor layer of said first conductivity type forming said collector region; and
    an emitter region composed of a third semiconductor film of silicon carbide formed of the same material as that of said second discrete semiconductor film, in contact with at least one portion of said second discrete semiconductor film.

2. A bipolar transistor claimed in claim 1 wherein it is so configured that under a bias voltage condition for operating the bipolar transistor, the whole of said second semiconductor film is brought into a depletion condition.

3. A bipolar transistor claimed in claim 1 further including an insulating film formed on said semiconductor substrate and having an opening exposing said semiconductor layer, said first and second semiconductor films being formed within said opening, a first polycrystalline semiconductor film of said second conductivity type formed having an extension extending inwardly from the whole of periphery of said opening by a predetermined distance so as to leave a central portion of said opening, a second polycrystalline semiconductor film of said second conductivity type formed to extend downward from a bottom of said extension of said first polycrystalline semiconductor film, said second polycrystalline semiconductor film being in contact with said first semiconductor film at a middle level of an inner wall height of said opening.

4. A method for manufacturing a bipolar transistor according to claim 1, comprising the steps of:

forming a first insulating film on a surface of a semiconductor layer of a first conductivity type formed of a silicon semiconductor substrate;

forming a first polysilicon semiconductor film having a first opening on said first insulating film;

forming a second insulating film on a surface of said first polysilicon semiconductor film and a side surface of said first opening;

selectively removing said first insulating film using said second insulating film and said first polysilicon semiconductor film as a mask, to form in said first insulating film a second opening larger than said first opening;

growing a first polycrystalline semiconductor film of a second conductivity type formed of a material selected from the group consisting of silicon film, a silicon-germanium mixed-crystal film, and a composite film, from the surface of said semiconductor layer within said second opening, said second conductivity type being opposite to said first conductivity type;

growing a second polycrystalline semiconductor film of said second conductivity type from a lower surface of a projection of said first polycrystalline semiconductor film projecting into said second opening, so that said first and second polycrystalline semiconductor films become in contact with each other;

growing from the surface of said first semiconductor film, a second semiconductor film of silicon carbide having a forbidden band width larger than that of said first semiconductor film, until said second semiconductor film becomes in contact with said second insulating film; and growing from a surface of said semiconductor film, a third semiconductor film of silicon carbide composed of the same material as that of said second semiconductor film.

5. A method as claimed in claim 4 in which the growth of said first, second and third semiconductor films are continuously formed in the same apparatus.

* * * * *

UNITED STATES PATENT AND TRADEMARK OFFICE
CERTIFICATE OF CORRECTION

PATENT NO. : 6,049,098
DATED       : April 11, 2000
INVENTOR(S) : FUMIHIKO SATO

It is certified that error appears in the above-identified patent and that said Letters Patent is hereby corrected as shown below:

Col. 11, lines 20 and 21, change "according to" to - -as claimed in- -.
Col. 12, line 6, insert - -composed of silicon film, and a silicon geranium mixed crystal film- - after "film" (second occurrence).

Signed and Sealed this

Twentieth Day of March, 2001

Attest:

NICHOLAS P. GODICI

Attesting Officer         Acting Director of the United States Patent and Trademark Office